United States Patent [19]
Birchler et al.

[11] 4,043,027
[45] Aug. 23, 1977

[54] PROCESS FOR ENCAPSULATING ELECTRONIC COMPONENTS IN PLASTIC

[75] Inventors: Robert O. Birchler, Dallas, Tex.; E. R. Williams, Jr., Scottsdale, Ariz.

[73] Assignee: Texas Instruments Incorporated, Dallas, Tex.

[21] Appl. No.: 384,768

[22] Filed: July 30, 1973

Related U.S. Application Data

[60] Continuation of Ser. No. 768,311, Oct. 17, 1968, abandoned, which is a division of Ser. No. 331,006, Dec. 16, 1963, Pat. No. 3,439,238.

[51] Int. Cl.² .............................................. B01J 17/00
[52] U.S. Cl. ..................................... 29/588; 264/272
[58] Field of Search ............. 29/588, 576 S; 264/272, 264/251; 425/123, 108

[56] References Cited

U.S. PATENT DOCUMENTS

| | | | |
|---|---|---|---|
| 2,436,597 | 2/1948 | Otis | 264/272 |
| 3,221,089 | 11/1965 | Cotton | 29/588 |
| 3,367,025 | 2/1968 | Doyle | 29/588 |

Primary Examiner—W. Tupman
Attorney, Agent, or Firm—Harold Levine; James T. Comfort; Gary C. Honeycutt

[57] ABSTRACT

A method of making a semiconductor device is disclosed in which a plurality of generally parallel conductors are provided, at least one of which has a mounting portion thereon. A semiconductor wafer is coupled to the mounting portion while means are provided for coupling the other conductors to the semiconductor wafer. An integrally molded mass of insulation material embeds the semiconductor wafer, and the mounting portion, as well as the means connecting the conductors to the semiconductor wafer.

17 Claims, 14 Drawing Figures

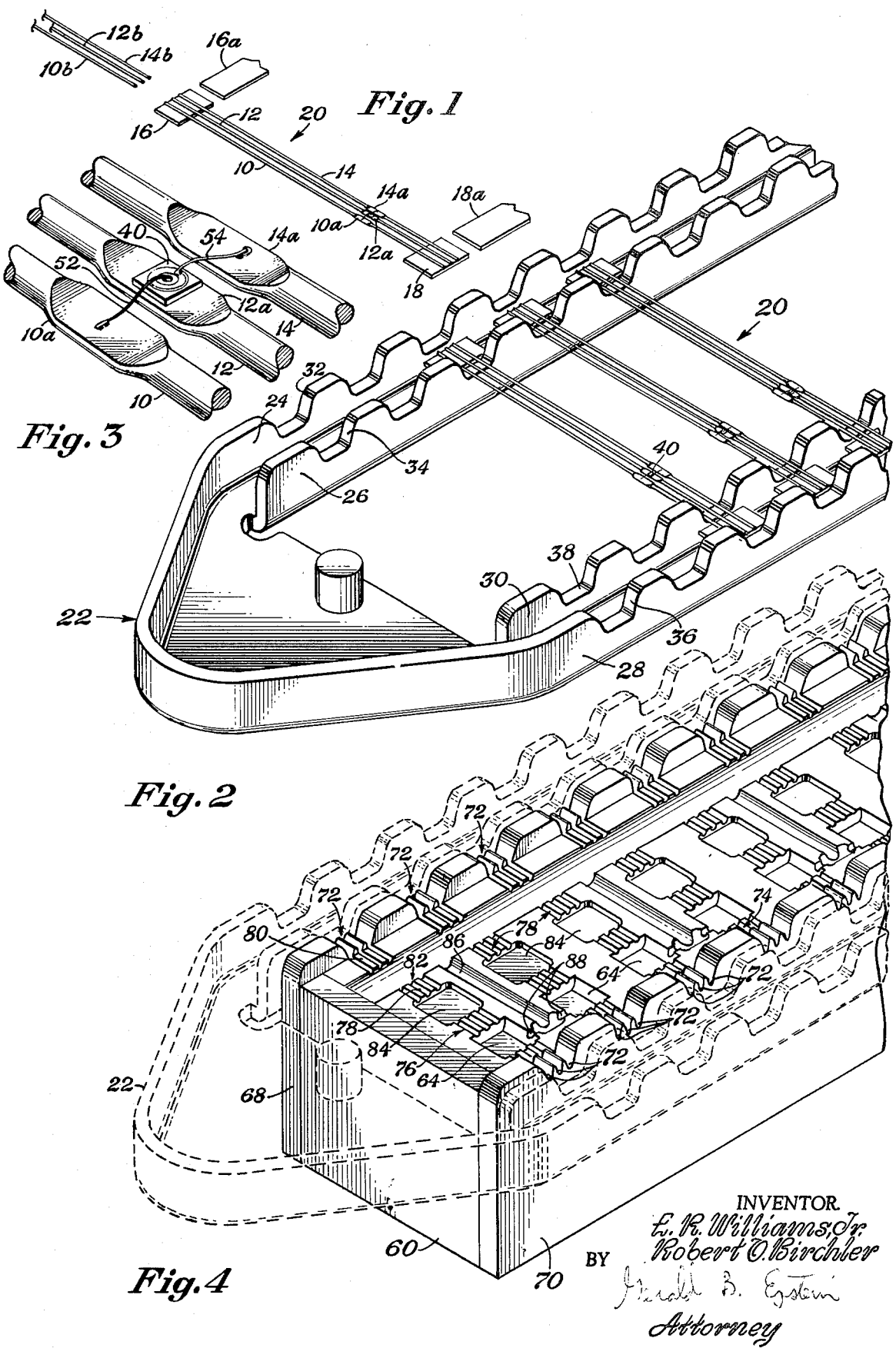

INVENTOR.
L. R. Williams, Jr.
BY Robert O. Birchler

Gerald B. Epstein
Attorney

PROCESS FOR ENCAPSULATING ELECTRONIC COMPONENTS IN PLASTIC

This application is a continuation of U.S. patent application, Ser. No. 768,311, filed Oct. 17, 1968, now abandoned, which in turn is a division of U.S. patent application, Ser. No. 331,006, filed Dec. 16, 1963, and now U.S. Pat. No. 3,439,238.

The present invention relates generally to the manufacture of semiconductor devices, and more particularly, but not by way of limitation, relates to an improved process for encapsulating electrical circuit devices, such as transistors, integrated circuits and the like, in plastic, and to the novel transistor resulting therefrom.

In general, semiconductor devices are very small and delicate, and economical manufacture of high quality devices in a practical and usable form presents serious difficulties. For example, the devices usually must have electrical leads sufficiently large that they can be easily soldered or otherwise connected in a circuit. The device must be so constructed as to withstand handling and for many applications must withstand high mechanical shock loads. The active components must be encased in an electrically non-conductive environment and should be protected from light. The environment should also be such as will conduct heat away from the active regions of the device.

One common semiconductor device construction is represented by the alloy transistor which in general comprises a relatively large base member having a collector alloyed to one side and an emitter alloyed to the other side. It is customary to mechanically connect the device to a tab portion of a header for support and to make an electrical connection between one active region, usually the base, and the header. Two additional lead wires extend through the header and are secured in spaced relationship and insulated by a glob of glass. The other active regions of the alloy device are connected to the ends of the lead wires by very fine whisker wire leads. The active transistor device is then covered by a so-called can which, together with the header, completely encapsulates the active components in a dry ambient. In general, the header constitutes a major portion of the cost of the transistor.

In addition to encapsulating alloy devices in cans, the devices have also been dipped in various liquids which subsequently solidify to form a hard glob of encapsulating material. More recently, the active portions of alloy transistors have been encapsulated in plastic by casting techniques using the conventional expensive header to hold the device during the construction steps and a mold resembling the conventional transistor can. There have been reports that germanium alloy transistors have been encapsulated using transfer molding techniques, but again with the use of expensive headers. Encapsulation of an alloy device is not unusually difficult because mechanically it is inherently relatively strong. However, these plastic encapsulated alloy devices have not been generally accepted on the market because of unacceptably high leakage currents.

A planar type transistor offers distinct operating advantages over alloy type devices when encapsulated in a solid environment, such as plastic, because of the fact that the surface junctions between the active regions can be protected by suitable non-conductive material to reduce leakage currents. However, the planar transistor is very small and delicate, and successful encapsulation in plastic, particularly by transfer molding techniques, constitutes a considerable problem. Nearly all commercially available planar transistors are manufactured by using a header and transistor can substantially as heretofore described. However, this type of transistor, with the aid of a header, has been encapsulated by dipping it in a liquid which subsequently solidifies, or by casting an epoxy resin around the active components.

The present invention is concerned with plastic encapsulation of very tiny and very delicate electrical circuit devices by transfer molding techniques, and in particular relates to a process for manufacturing an improved planar type transistor or the like on an economical, mass production basis without the use of a header. In its broader aspects, the invention entails encapsulating a semiconductor or other miniaturized electrical device having a plurality of electrical terminals in plastic by connecting each of the electrical terminals to a midpoint of a conductor wire and holding the opposite ends of the conductor wires while the device and the adjacent midpoints of the conductor wires are encapsulated in the plastic. More specifically, the novel process entails disposing three relatively large conductor wires in generally parallel relationship, mechanically attaching a transistor wafer to a midpoint of one of the conductors so as to make electrical contact between the conductor and an active region of the wafer, and interconnecting each of the other active regions of the wafer with one of the other conductor wires by very small whisker wire leads. The center portions of the conductors, the transistor wafer and the whisker wire leads are then disposed within a mold cavity with the opposite ends of the conductor wires extending from the mold cavity. The ends of the conductor wires are clamped on each side of the mold cavity to prevent movement of the conductor wires as the fluid plastic material is injected into the mold cavity to encapsulate the transistor.

An important aspect of the invention is the manner in which the fluid plastic material is gated into the mold so as to prevent damage to the delicate whisker wire leads and transistor wafer. In general, this entails introducing the material into a portion of the mold cavity remote from the transistor device and whisker wire leads, and generally parallel to the whisker wire leads.

Another aspect of the invention relates to a complete manufacturing process for assembling, encapsulating and handling a gang of miniaturized devices for convenient testing, processing, and packaging.

The present invention also contemplates a novel transistor construction employing only a single, integral mass of encapsulating material having a unique and useful shape and having leads extending from opposite ends thereof so that the device can be very securely connected to a circuit board.

Therefore, an important object of the present invention is to provide an improved process for manufacturing transistors and other electrical circuit devices having very small active parts and extremely delicate leads on an economical mass production basis.

Another object of the present invention is to provide a process for encapsulating very small and fragile electrical circuit devices in plastic using transfer molding techniques.

Yet another object of this invention is to provide a process for transfer molding a planar device.

Still another object of the invention is to provide a process for encapsulating a transistor by molding without using a header.

Many additional objects and advantages will be evident to those skilled in the art from the following detailed description and drawings, wherein:

FIG. 1 is a perspective view of an assembly illustrating an initial step in the process of the present invention;

FIG. 2 is a perspective view of a portion of a rack holding a plurality of the assemblies shown in FIG. 1 preparatory to further processing;

FIG. 3 is an enlarged perspective view of a portion of the assembly of FIG. 1 illustrating another step of the process of the present invention;

FIG. 4 is a perspective view of the lower half of a multiple-mold die which may be used in performing another step in the process of the present invention;

Figure 3A:
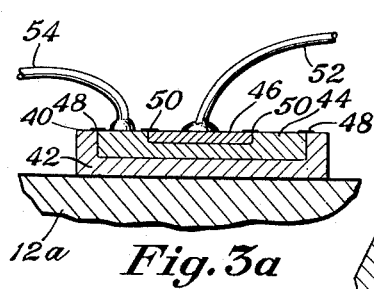
FIG. 3a is an enlarged, partial sectional view of the transistor wafer shown in FIG. 3.

The process of the present invention will be described in connection with the manufacture of a plurality of transistors and can be best understood by reference to the drawings. Referring now to FIG. 1, the opposite ends of three conductor wires 10, 12 and 14 disposed generally in parallel relationship and preferably within a common plane, are welded or otherwise attached to metal tabs 16 and 18 to form an assembly designated generally by the reference numeral 20. Intermediate adjacent portions of the conductors are flattened at 10a, 12a and 14a, respectively, for purposes which will hereafter be described. The assembly 20 may be fabricated by any suitable technique. For example, the conductor wires 10, 12 and 14 may conveniently originate from continuous strands 10b, 12b and 14b and the metal tabs 16 and 18 may conveniently originate from continuous metal straps 16a and 18a, respectively. Then a single tool can simultaneously shear the three conductor wires and the two tabs, weld the ends of the conductor wires to the tabs by passing an electrical current therethrough, and also flatten the portions 10a, 12a and 14a of the wires.

Next a plurality of the assemblies 20 are loaded in a suitable carrier indicated generally by the reference numeral 22 in FIG. 2. The carrier 22 has a pair of spaced runners 24 and 26 extending along one side and a similar pair of spaced runners 28 and 30 extending along the other side. The runners have a set of aligned notches, 32, 34, 36 and 38, for receiving each of the assemblies 20. It will be noted that the slots are tapered so as to easily receive the assemblies and then accurately guide the assemblies to preselected positions. It will be noted that the tabs 16 are received between the runners 24 and 26, and the tabs 18 are received between the runners 28 and 30. The carrier provides a convenient means for handling a plurality of assemblies 20 through the succeeding steps of the encapsulating operation.

The assemblies 20 should than be immersed in a suitable solvent and cleaner to remove all greases and thoroughly clean the flattened portions 10a, 12a and 14a. A transistor wafer 40 is electrically and mechanically connected to the flattened portion 12a of each of the conductor wires 12 by any suitable method. The transistor wafer 40 is preferably of the type illustrated generally by the enlarged sectional view of FIG. 3a and comprises a collector 42 having a base 44 and emitter 46 diffused therein by conventional techniques so as to provide a conventional planar device. Schematically illustrated oxide films 48 and 50 insulate the surface junctions between the active regions to prevent leakage currents in the well-known manner. The transistor wafer 40 may be alloyed to the flattened portion 12a so as to provide a good mechanical bond and also to provide an electrical connection between the conductor wire 12 and the collector 42. Next the carrier 22 is placed in a suitable micromanipulating mechanism so that whisker wire leads can be successively attached to the flattened portions of each of the assemblies 20 in the manner illustrated in FIG. 3. A very fine gold whisker wire lead 54 is attached to the base region 44 of the wafer 40 by a low resistivity connection. The other end of the whisker wire lead 54 is attached to the flattened portion 14a of the conductor wire 14. A second whisker wire lead 52 is attached to the emitter 46 of the transistor wafer and to the flattened portion 10a of the conductor wire 10. At this point it is well to note that the whisker wire leads 52 and 54 are very small and will customarily be on the order of one mil in diameter as compared to the conductor wires 10, 12 and 14 which will be on the order of ten mils in diameter. It will also be noted that the entire transistor assembly, including the wafer and whisker wire leads, is connected to one side of the assembly 20. The flattened portions of the conductor wires 10, 12 and 14 increase the available surface area for bonding the wafer and whisker wire leads to the conductor wires to thereby increase the strength of the respective bonds. It will also be noticed that the conductor wire 10 is now connected to the base 44 by the whisker lead 52, the conductor wire 12 is connected directly to the collector 42, and the conductor wire 14 is connected to the emitter 46 by the whisker lead 54.

Figure 5:
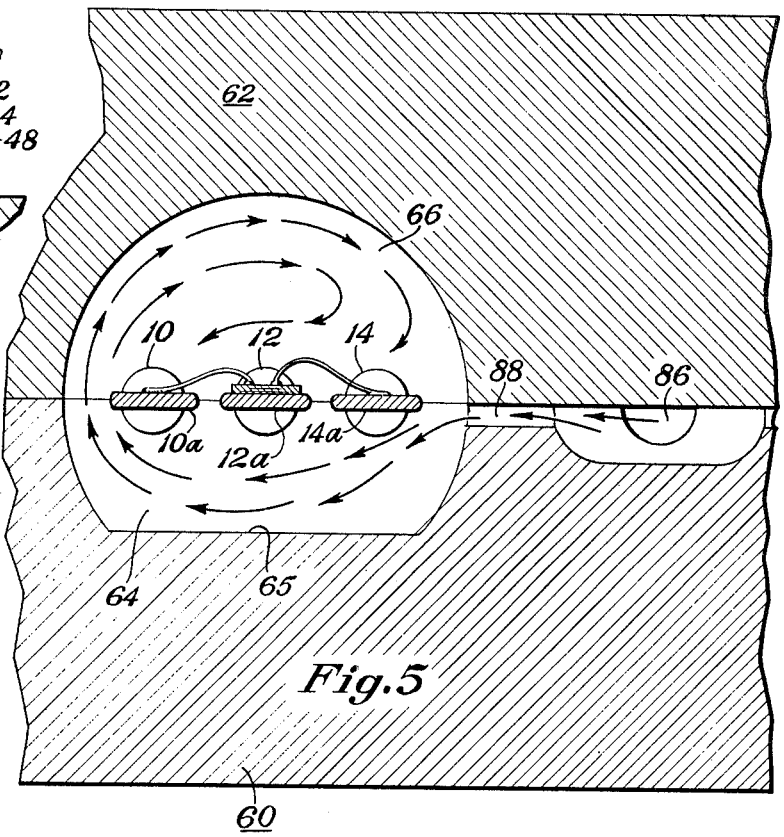
FIG. 5 is an enlarged sectional view of one of the mold cavities formed by the mating of the die of FIG. 4 and a complementary die.

Next the carrier 22 is placed around a lower mold die 60 as illustrated in FIG. 4. A complementary upper mold die 62 is illustrated only partially in FIG. 5. The lower mold die 60 has a plurality of mold cavity halves 64 suitably positioned to receive the flattened portions 10a, 12a and 14a of the conductor wires and of course the transistor wafer 40 and whisker leads 52 and 54. The upper die 62 has a corresponding number of mold cavity halves 66, one of which is illustrated in FIG. 5, arranged in mating relationship with the mold cavity halves 64 in the lower die. The lower die 60 is provided with guide plates 68 and 70 which extend longitudinally along opposite edges of the die.

Each of the guide plates 68 and 70 is provided with three tapered grooves 72 for receiving the conductor wires 10, 12 and 14 of each of the assemblies 20 in the carrier 22. The tapered grooves properly locate the conductor wires so that they are received in grooves 74 and 76 disposed on opposite sides of the mold cavity halves 64, and in similar grooves 78 and 80 which are disposed on either side of a main runner groove 82, the purpose of which will presently be described. The die may be cut away at 84 so as to reduce the likelihood that one of the conductor wires will not lie completely within the grooves 74 or 80. It will also be noted that the lower die cavity halves 64 have a flat bottom 65 for purposes which will hereafter be described in greater detail.

The upper die 62 has a complementary arrangement of grooves for receiving the upper halves of the conductor wires 10, 12 and 14 on each assembly 20 and also has a complementary runner groove for mating with the runner groove 82. However, only the lower die 60 is provided with secondary runner grooves 86 which communicate with the lower mold cavity halves 64 through suitable gates 88, as can best be seen in FIG. 5. It will be noted that each of the secondary runner grooves 86 communicates with two mold cavity halves 64. In accordance with an important aspect of the invention, it will also be noted that the gates 88 are positioned off-center with respect to the mold cavity halves 64 so that material will be injected into the mold cavity in a predetermined relation to the transistor assembly as will presently be described.

With reference to FIG. 5, it will be noted that the conductor wires 10, 12 and 14 are clamped between the upper and lower dies and are located within the grooves 74 and 76. It will also be noted that since the transistor wafer 40 and the whisker wire leads 52 and 54 are connected to the tops of the flattened portions 10a, 12a and 14a, the wafer and whisker wire leads are positioned in the upper mold cavity half 66. On the other hand, the gate 88 is located in the lower mold cavity half 64 and as previously mentioned is off-set from the center of the mold cavity so as to direct material into the mold cavity at a point remote from the transistor device and its connecting whisker wire leads. Thus, it will be noted that material will be directed through the gate 88 into the lower mold cavity half 64 along a path generally parallel to the whisker wire leads 52 and 54 as indicated by the arrows in FIG. 5. Although the mold material is injected at a relatively high velocity transversely of the conductor wires 10, 12 and 14, it will be appreciated that these wires have diameters approximately ten times as great as the whisker wire leads 52 and 54. Further, since the conductor wires 10, 12 and 14 are securely clamped in the grooves between the dies 60 and 62, displacement of the conductor wire is held to an absolute minimum so that the likelihood of breaking the whisker leads 52 or 54 is held to a minimum.

In the molding process, the fluid plastic material is transferred under considerable pressure and at substantial velocity down the main runner formed by the groove 82 in the lower die 60 and its mating groove (not illustrated) in the upper die 62. It will be noted that the conductor wires 10, 12 and 14 of each assembly 20 pass through the center of this main runner. However, since the wires are securely held in the grooves 78 and 80 and the mating grooves in the upper die, the wires will not be unduly flexed so as to cause breakage of the connections of the transistor device. The material then passes through the secondary runner grooves 86 and is gated into the die cavities around the flattened portions of the conductor wires and around the transistor device.

Figure 6:
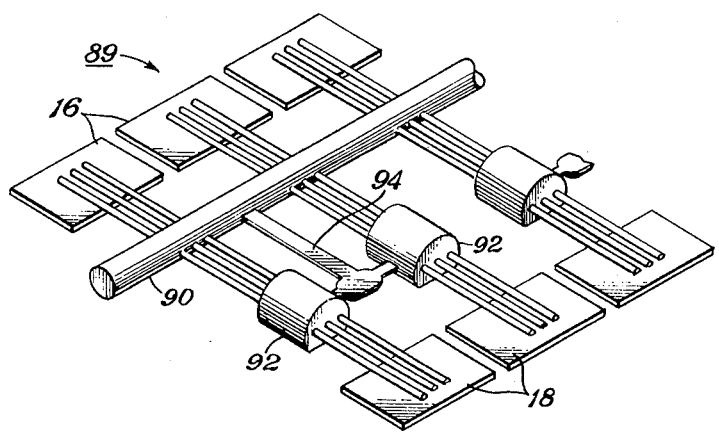
FIG. 6 is a fragmentary perspective view of a gang of transistors when first removed from the mold and serves to illustrate another step of the process of the invention.
Figure 7:
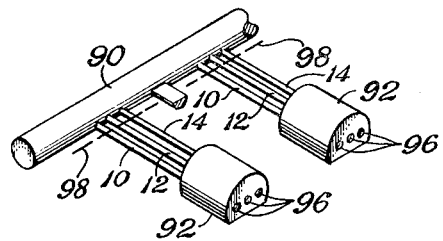
FIG. 7 is a fragmentary perspective view of the gang of transistors illustrated in FIG. 6 after an intermediate step and preparatory to testing.

After the transfer molding process is completed, the dies 60 and 62 are separated and the gang 89 of encapsulated transistors illustrated in FIG. 6 is removed. It will be noted that the plastic material remaining in the main runner formed by the runner groove 82 and the complementing groove in the upper die forms a stringer 90 which interconnects the conductor wires of the several transistor devices and holds the wires of each device in spaced relationship. Next the tabs 16 and 18 are removed from the opposite ends of conductor wires 10, 12 and 14 by severing the conductor wires preferably immediately adjacent the end of each encapsulating material 92 and immediately adjacent the stringer 90 substantially as illustrated in FIG. 7. The surplus mold material 94 from the secondary runner may also easily be broken away by reason of the reduced portions formed by the gates 88 immediately adjacent the transistor device. While the gang of encapsulated transistors are held together by the stringer 90, the ends 96 of the conductor wires 10, 12 and 14 are preferably ground off flush with the end of the encapsulating material 92 and coated with a suitable insulating material. The gang of transistors can also be very easily tested while interconnected by the stringer 90 since the conductor wires 10, 12 and 14 are now electrically isolated one from the other except through the transistor wafer. Finally, the conductor wires 10, 12 and 14 may be severed generally along the dotted lines 98 to complete the transistor construction.

Figure 8A:
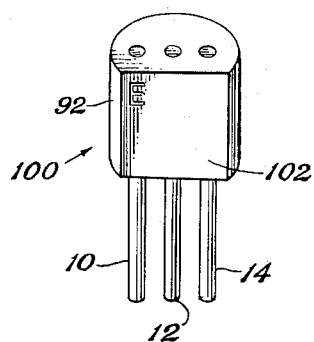
FIGS. 8a-8c are perspective views of various transistors constructed in accordance with the present invention.

Referring now to FIG. 8a, a transistor constructed in accordance with the present invention is indicated generally by the reference numeral 100. It will be noted that the encapsulating material 92 has a flat face 102 which is disposed parallel to the plane of the three conductor wires extending from the encapsulating material. In addition to assisting the connection of the transistor to a circuit board, as will presently be described, the flat face 102 serves as a reference surface upon which a reference mark, such as the letter E, may be placed to indicate that the left-hand conductor wire 10 is the emitter, the center lead 12 is the collector and the right-hand conductor wire 14 is the base.

Several important aspects of the construction of the transistor 100 will be recalled from the drawings illustrating the intermediate steps of the manufacturing process. For example, it will be recalled that the conductor wires 10, 12 and 14 had flattened portions 10a, 12a and 14a. These flattened portions not only serve to increase the quality of the mechanical and electrical connections between the respective conductor wires and the wafer 40 and the whisker wire leads 52 and 54, but also serve to key each of the conductor wires 10, 12 and 14 in the plastic encapsulating mass so that the respective conductor wires can neither be twisted within the mass nor pulled longitudinally from the mass. In this regard it will be appreciated that very little or no surface bond results between the plastic encapsulating material and the metal conductor wires 10, 12 and 14.

Figure 8B:
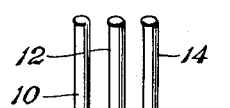

Another important aspect of the present invention is indicated by the transistor device 110 in FIG. 8b. The transistor device 110 may be manufactured by the process previously described except that the conductor wires 10, 12 and 14 may originally be sufficiently long to extend in both directions from the encapsulating material 92. This permits electrical connection to be made with the emitter, collector, and base from either end of the device. But more importantly, the respective conductor wires can subsequently be cut away to a customer's specification so that any arrangement of leads from the emitter, collector and base can be provided for integration into substantially any circuit.

Figure 8C:
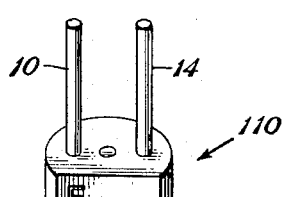
Figure 8D:
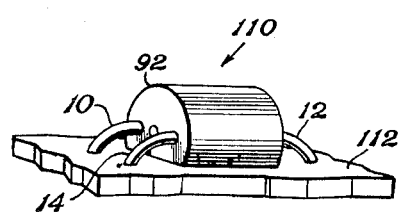
FIG. 8d is a perspective view illustrating how the transistor of FIG. 8c can be connected to a circuit board.

For example, a transistor 110 as illustrated in FIG. 8c can be constructed by severing the conductor wire 12 from one end of the encapsulating material 92 to leave the emitter lead wire 10 and the base wire 14 extending in one direction. At the other end of the encapsulating material 92, the conductor wires 10 and 14 may be severed to leave only the collector wire 12. Then the device 110 may be connected to a circuit board substantially as illustrated in FIG. 8d by placing the flat surface 102 on the surface of the circuit board 112 and passing the conductor wires 10, 12 and 14 through suitable apertures in the circuit board for connection in a circuit on the opposite side of the board. It will be appreciated that the flat surface 102 facilitates the positioning of the device 110 preparatory to connecting the conductor wires 10, 12 and 14 in the circuit, and also facilitates automatic handling and orientation of the device.

As previously mentioned, the conductor wires 10, 12 and 14 may be on the order of 10 mils in diameter so that the transistor described and illustrated will be approximately the same size as standard transistors presently on the market. This wire size provides a very sturdy assembly 20 and permits a simple carrier 22 to be used to handle the assemblies during the various steps of the manufacturing process. However, if it is desired to make the transistors appreciably smaller, the conductor wires must also be made smaller and the assembly 20 does not have sufficient strength to withstand handling. An alternative process for manufacturing a much smaller transistor in accordance with the present invention is illustrated by FIGS. 9 and 10.

Figure 9:
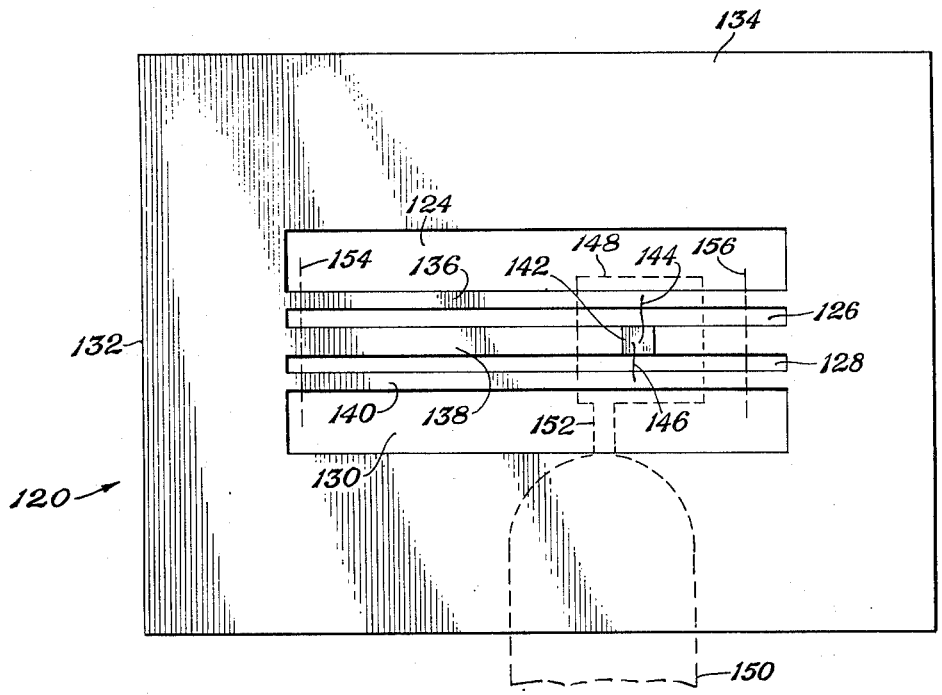
FIG. 9 is a top view of an intermediate article which serves to illustrate alternative steps which may be employed in practicing the process of the present invention.

Referring now to FIG. 9, an assembly 120 is formed by punching four elongated slots 124, 126, 128 and 130 from a generally rectangular sheet of thin metal 132. This forms a rectangular support 134 which interconnects the ends of conductor wires 136, 138 and 140, which correspond to the conductor wires 10, 12 and 14 of the assembly 20. A suitable transistor wafer 142 may then be alloyed to the center conductor wire 138 and whisker wire leads 144 and 146 connected to the appropriate active regions of the wafer and to the other conductor wires 136 and 140, respectively. Next one or more of the assemblies 120 can be placed between suitable molding dies which form a mold cavity in the area indicated by the dotted outline 148. The conductor wires 136, 138 and 140 are again tightly clamped between the dies on either side of the mold cavity 148 to hold the conductor wires against the force of the injected plastic.

A runner 150 may be placed in communication with the mold cavity 148 through a suitable gate 152. Again it will be noted that the gate 152 is off-set from the transistor wafer 142 and whisker wire leads 144 and 146, and is preferably located wholly within the portion of the mold cavity formed by the lower die. In this connection, it will be appreciated that the flat conductor wires 136, 138 and 140 may conveniently be received entirely within rectangular grooves in the upper die so that the entire conductor wires will be disposed above the gate 152. Then as the encapsulating material is injected into the mold cavity 148 at a high velocity, it will first enter the cavity below the conductor wires at a point off-set from the fragile whisker wire leads 144 and 146. It will also be noted that the greatest cross-sectional dimensions of the conductor wires 136, 138 and 140 are disposed to receive the major force of the incoming encapsulating material. Further, the leads are securely clamped between the dies in opposite sides of the mold cavity to insure that the leads are not displaced to such an extent as to part one of the whisker leads or to cause a short. All or a portion of the mold cavity 148 may be generally rectangular so as to provide a flat surface for marking and to assist in assembly.

Figure 10:
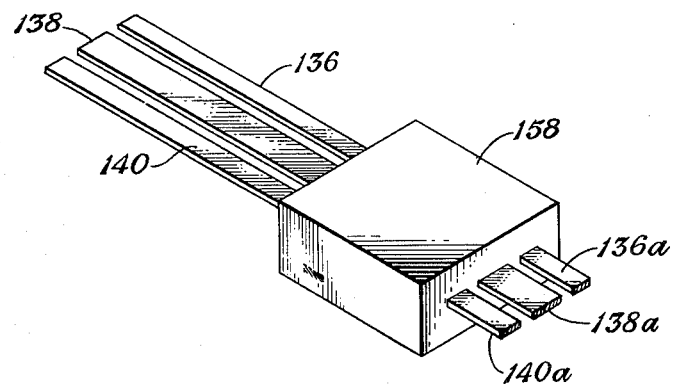
FIG. 10 is a perspective view of another transistor device constructed in accordance with the process illustrated in FIG. 9.

After the transfer molding is completed, the conductor wires 136, 138 and 140 may be severed generally along the dotted lines 154 and 156 to produce the structure illustrated in FIG. 10. The ends 136a, 138a and 140a of the conductor wires extending from the encapsulating material 158 may be ground away and coated with a suitable insulating material to complete the construction. Or the conductor wires 136, 138 and 140 can initially be long enough to extend in both directions from the encapsulating material 158 in order to produce a device similar to that illustrated in FIGS. 8b or 8c.

From the above detailed description of preferred embodiments of the present invention, it will be evident that a process for encapsulating very fragile electrical devices having a plurality of electrical leads by transfer molding has been disclosed. The process can be carried out very economically on a mass production basis. The process is particularly adapted to encapsulate a plurality of devices at the same time and to provide a means for subsequently handling a gang of the devices for testing purposes. The process is particularly adapted to the manufacture of transistors, but can be used, in its broader aspects, for manufacturing various other electrical devices such as integrated circuits. The transistor resulting from the process is particularly unique in that leads may extend in either direction from the encapsulating material in order to facilitate connecting the device in a circuit. In particular, the device can be securely connected from a mechanical standpoint to a circuit board or the like. Further, the flattened portions of the conductor wires within the encapsulating material resists both torsional and longitudinal mechanical loads on the conductor wires so that the conductor wires are securely held by the encapsulating material. Any slippage of the conductor wires within the encapsulating material would tend to break the whisker wire lead connections.

The transfer molding technique permits the use of a silicone plastic which results in a better ambient for the planar type transistor device. Further, the transfer molded encapsulation material may have a greater volume of filler without danger of the filler settling out during the molding process. A process for encapsulating very small devices by transfer molding has also been described which eliminates any fabrication steps involved in interconnecting and flattening the conductor wires. This process permits the manufacture of very small devices on a very economical and mass production basis.

Although specific embodiments of the invention have been described in detail, it is to be understood that various changes, substitutions and alterations can be made therein without departing from the spirit and scope of the invention as defined by the appended claims.

What is claimed is:

1. A process for encapsulating a miniaturized semiconductor device having a multiplicity of electrical terminals comprising the steps of:

electrically connecting each of the electrical terminals of the device to an intermediate point of a conductor and mechanically attaching each component of the device to at least one of the conductors for support, disposing the device and the adjacent intermediate portions of the conductors in a mold cavity with the opposite ends of each of the conductors extending from generally opposite sides of the mold cavity, and holding the opposite ends of the conductors extending from the mold cavity while injecting a fluid insulating material into the mold cavity which will subsequently solidify, the fluid insulating material being injected into a portion of the mold cavity remote from the device and the means electrically connecting the terminals of the device to the conductors, whereby the fluid will not directly engage the device and electrical connection means at a high velocity and the conductors will be secured against appreciable displacement by the fluid which would be likely to break or displace a connection means in such a manner to cause a failure of the device.

2. A process for encapsulating a miniaturized semiconductor device having a multiplicity of electrical terminals comprising the steps defined in claim 1 wherein:

the conductor wires are disposed generally in a common plane, the device and a major portion of the means making electrical connection between the terminals and the conductor wires are disposed generally on one side of the plane, and the fluid insulating material is injected into the mold cavity on the other side of the plane.

3. A process for encapsulating a miniaturized semiconductor device having a multiplicity of electrical terminals comprising the steps defined in claim 1 wherein:

the conductor wires are disposed generally parallel, the device and a major portion of the means making electrical connection between the terminals and the conductor wires are disposed generally at transversely aligned points on the conductor wires, and the fluid insulating material is directed into the metal cavity generally normal to the conductor wires and at a point spaced longitudinally along the conductor wires from the point at which the device is disposed.

4. A process for encapsulating a miniaturized semiconductor device having a multiplicity of electrical terminals comprising the steps defined in claim 1 wherein:

the conductor wires are disposed generally parallel and in a common plane, the device and a major portion of the means making electrical connection between the terminals and the conductor wires are disposed generally on one side of the plane and are aligned generally transversely of the conductor wires, and the fluid insulating material is directed into the mold cavity generally normal to the conductor wires and at a point longitudinally spaced along the conductor wires from the device and on the other side of the plane.

5. A process for manufacturing a transistor comprising the steps of:

mechanically connecting a transistor wafer to a midpoint of a first conductor and electrically connecting a first active region of the transistor to the conductor, connecting a first whisker wire lead to a second active region of the transistor wafer and to a midpoint of a second conductor disposed generally parallel to the first conductor, connecting a second whisker wire lead to a third active region of the transistor and to a midpoint of a third conductor disposed generally parallel to the first and second conductors, placing the transistor wafer, the whisker wire leads and the adjacent portions of the conductors in a mold cavity with the opposite ends of the conductors extending from generally opposite sides of the mold cavity, and injecting a fluid material into the mold cavity which will subsequently solidify while holding the ends of the conductors to prevent excessive movement of the conductors and breakage of the whisker wire leads or connections thereof.

6. A process for manufacturing a transistor comprising the steps of:

disposing three conductor wires generally in parallel relationship and connecting tabs to the ends of the wires to form an assembly securing the conductor wires in parallel relationship, attaching a transistor wafer to a midpoint of one of the conductor wires for support and for making electrical contact with an active region of the wafer, attaching a first whisker wire lead to another active region of the wafer and to another of the conductor wires, attaching a second whisker wire lead to the other active region of the wafer and to the other of the conductor wires, disposing the wafer, the whisker wire leads and the adjacent portions of the conductor wires in a mold cavity with opposite end portions of the conductor wires extending from the cavity, and injecting a fluid insulating material into the mold cavity which will subsequently solidify while holding the conductor wires on opposite sides of the mold cavity to prevent excessive movement of the conductor wires which would tend to part the whisker wire leads or the connections thereof.

7. A process for manufacturing a transistor comprising the steps of:

punching four generally parallel slots from a metallic plate to form a generally rectangular frame and three conductor wires disposed generally in parallel relationship and extending between two sides of the frame, attaching a transistor wafer to one of the conductor wires and electrically connecting an active region of the wafer to the conductor wire, attaching a first whisker wire lead to another active region of the wafer and to another of the conductor wires, attaching a second whisker wire lead to the other active region of the wafer and to the other of the conductor wires, disposing the wafer, the whisker wire leads and the adjacent portions of the conductor wires in a mold cavity with opposite ends of the conductor wires extending from the mold cavity, and injecting a fluid insulating material into the mold cavity which will subsequently solidify while holding the conductor wires on opposite sides of the mold cavity to prevent excessive movement of the conductor wires which would tend to part the whisker wire leads or the connections thereof.

8. A process for manufacturing a transistor comprising the steps of:

interconnecting the opposite ends of three conductor wires disposed generally in parallel relationship within a single plane by attaching the ends of the conductors to tabs to form an assembly having top and bottom sides, flattening the top sides of adjacent intermediate points of the three conductor wires generally in the plane of the wires, attaching a planar transistor wafer to the flattened top side of the center conductor wire such that the collector of the wafer will be electrically connected to the conductor wire, attaching a whisker wire lead to the base of the transistor and to the flattened top side of one of the outer conductor wires so as to extend generally normal to the conductor wires, attaching a whisker wire lead to the emitter of the transistor and to the flattened top side of one of the other conductor wires so as to extend generally normal to the conductor wires, disposing the wafer, the whisker wire leads and the flattened portions in a mold cavity formed by upper and lower dies with the conductor wires extending from generally opposite sides of the mold cavity and clamped between the upper and lower dies on opposite sides of the mold cavity and the wafer and whisker wire lead disposed in one-half of the mold cavity, injecting a fluid material which will subsequently harden and encapsulate the transistor into the other half of the mold cavity disposed adjacent the bottom side of the conductor wires at a point offset from the wafer and whisker wire leads and in a direction generally parallel to the whisker wire leads, and severing the tabs from the ends of the conductor wires to leave a length of each of the conductor wires extending in at least one direction from the encapsulating material.

9. A process for manufacturing a transistor comprising the steps defined in claim 8 wherein:

a plurality of assemblies are constructed and placed in side-by-side relationship between two dies having a mold cavity for receiving the wafer, whisker wire leads and flattened portion of each assembly and having an elongated mold cavity intersecting the conductor wires of all the assemblies, fluid material is injected into the elongated mold to form an elongated stringer interconnecting the conductor wires of all the assemblies, severing the tabs from the ends of the conductor wires such that the stringer will interconnect the several devices and the conductor wires will be electrically isolated one from the other such that the device can be tested, and then severing the conductor wires of each unit adjacent the stringer to separate the device from the stringer.

10. A process for manufacturing a transistor comprising the steps of:

forming an assembly having a rectangular frame and three conductor wires disposed generally in parallel relationship and extending between two sides of the frame, attaching a transistor wafer having three active regions to one side of one of the conductor wires and making electrical connection between each of the active regions and one of the conductive wires, disposing the transistor wafer and the adjacent portions of the conductor leads in a mold cavity, injecting a fluid insulating material into the mold which will subsequently harden and encapsulate the wafer and conductor wires, and severing the conductor wires from the frame on either side of the encapsulating material.

11. A process for manufacturing a transistor comprising the steps defined in claim 10 wherein:

the assembly is formed by stamping four elongated slots from a sheet of metal to produce the rectangular frame and three conductor wires.

12. The process for encapsulating a semiconductor device comprising:

electrically connecting each of the electrical terminals of the device to a conductor and mechanically attaching a portion of said device to at least one of the conductors for support;

disposing the conductors generally in a common plane;

disposing the device and a major portion of the means for making electrical connection between the terminals and the conductors generally on one side of the plane;

disposing the device and portions of the conductors in a mold cavity; and holding the ends of the conductors extending from the mold cavity while injecting a fluid insulating material into the mold cavity on the other side of the plane to subsequently solidify and embed said device, the fluid insulating material being injected into a portion of the cavity remote from the device and the means electrically connecting the terminals of the device to the conductors, whereby the fluid will not directly engage the device and electrical connection means at high velocity, and the conductors will be secured against appreciable displacement by the fluid.

13. A process for encapsulating a semiconductor device comprising:

electrically connecting electrical terminals of the device to a plurality of conductors;

disposing the device and portions of the conductors in a mold cavity, and restraining the conductors while injecting a fluid insulating material into the mold cavity for subsequently solidifying and embedding said device;

the fluid insulating material being injected into the mold cavity at a point offset from the semiconductor device and the electrical connections between the device and the conductors in a direction generally parallel to said connections, and into a portion of the cavity remote from the device and electrical connections between the terminals of the device and the conductors, so as to prevent direct high velocity engagement between the fluid and the device and the electrical connections thereto.

14. A process of encapsulating a semiconductor device comprising:
providing electrical connections between electrical terminals of the device and a plurality of conductors arranged in a substantially common plane, said device and the thusly provided electrical connections thereto being disposed on one side of said plane,
disposing the device and portions of the conductors in a mold cavity, and
holding the conductors while injecting a fluid insulating material into the mold cavity for subsequently solidifying and embedding said device,
the fluid insulating material being injected into a portion of the cavity on the opposite side of said plane to preclude direct high velocity engagement between the fluid and the device and the electrical connections thereto.

15. A process according to claim 14 wherein:
said mold cavity includes at least one generally flat wall spaced from and substantially parallel to said common plane to provide a generally flat reference surface upon completion of solidification of said fluid insulating material.

16. A process according to claim 14 wherein:
said plurality of conductors are further arranged in generally parallel relationship.

17. A process of encapsulating a semiconductor device comprising:
providing electrical connections between electrical terminals of the device and a plurality of conductors arranged substantially parallel to one another, said device and the thusly provided electrical connections thereto being provided on one side of said conductors,
disposing the device and portions of the conductors in a mold cavity, and
holding the conductors while injecting a fluid insulating material into the mold cavity for subseqently solidifying and embedding said device,
the fluid insulating material being injected into a portion of the cavity on the opposite side of said conductors to preclude direct high velocity engagement between the fluid and the device and the electrical connections thereto.

* * * * *